United States Patent [19]

Toyama et al.

[11] Patent Number: 5,592,659
[45] Date of Patent: Jan. 7, 1997

[54] TIMING SIGNAL GENERATOR

[75] Inventors: Akira Toyama; Tatsuyuki Agata, both of Tokyo, Japan

[73] Assignee: Yokogawa Electric Corporation, Tokyo, Japan

[21] Appl. No.: 549,948

[22] Filed: Oct. 30, 1995

[30] Foreign Application Priority Data

Nov. 24, 1994 [JP] Japan ................................. 6-289416

[51] Int. Cl.⁶ ........................................... G06F 1/04
[52] U.S. Cl. ................... 395/558; 364/270; 364/270.2; 364/DIG. 1
[58] Field of Search ..................... 395/550; 364/270, 364/270.2; 327/172, 175, 178, 184, 291

[56] References Cited

U.S. PATENT DOCUMENTS

| | | | |
|---|---|---|---|
| 4,231,104 | 10/1980 | St. Clair | 364/900 |
| 4,719,593 | 1/1988 | Threewitt et al. | 395/550 |
| 4,890,222 | 12/1989 | Kirk | 395/550 |

*Primary Examiner*—Thomas M. Heckler
*Assistant Examiner*—Dennis M. Butler
*Attorney, Agent, or Firm*—Moonray Kojima

[57] ABSTRACT

A timing signal generator wherein a rate signal generator applies clock signals whose phases are continuous and rate signals to a timing generator wherein delay times and fractional data available within the timing generator are used to thereby generate timing pulses without the need for rate fractional data to be applied from outside the timing generator so that the system is considerably simplified.

5 Claims, 7 Drawing Sheets

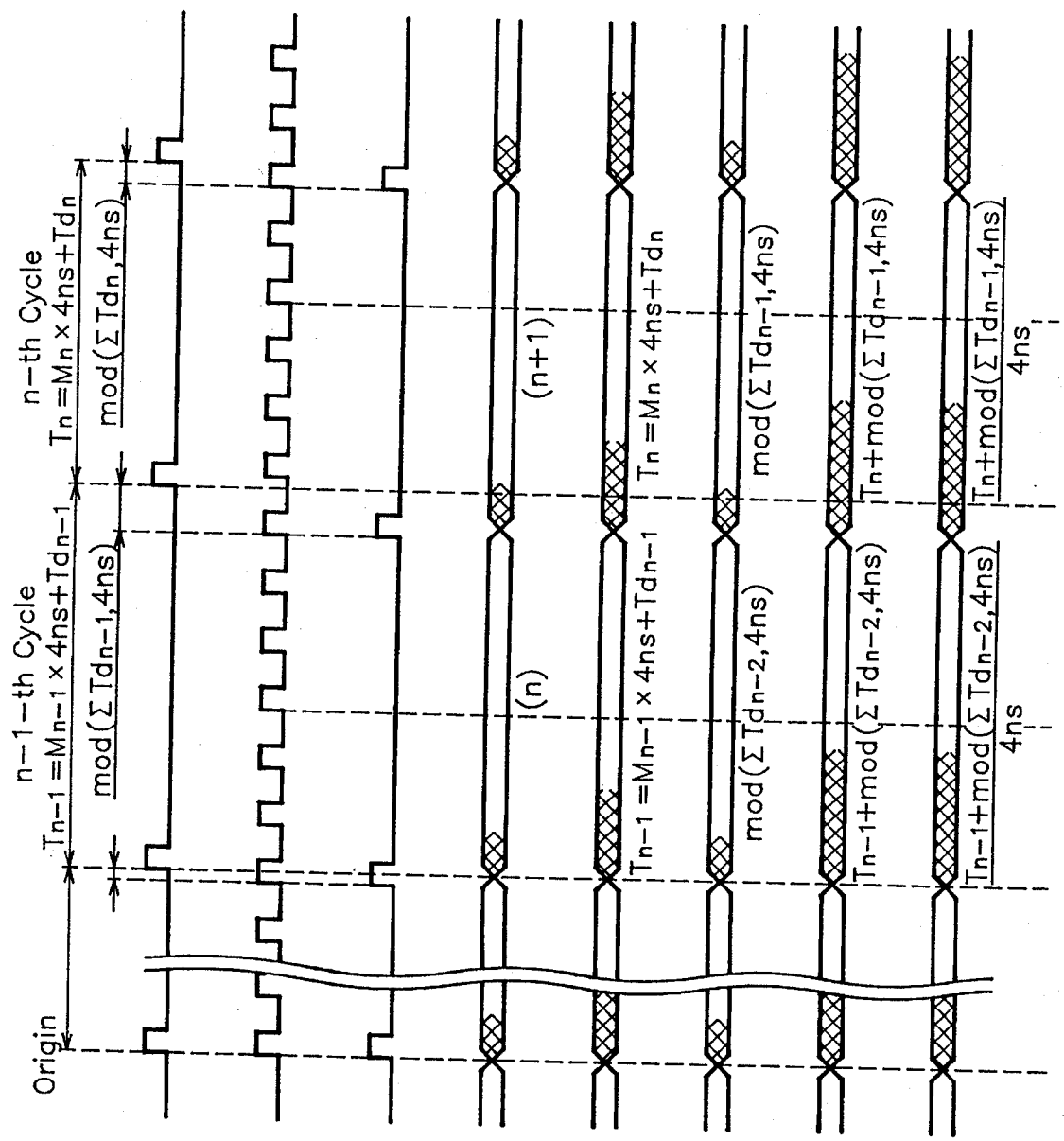

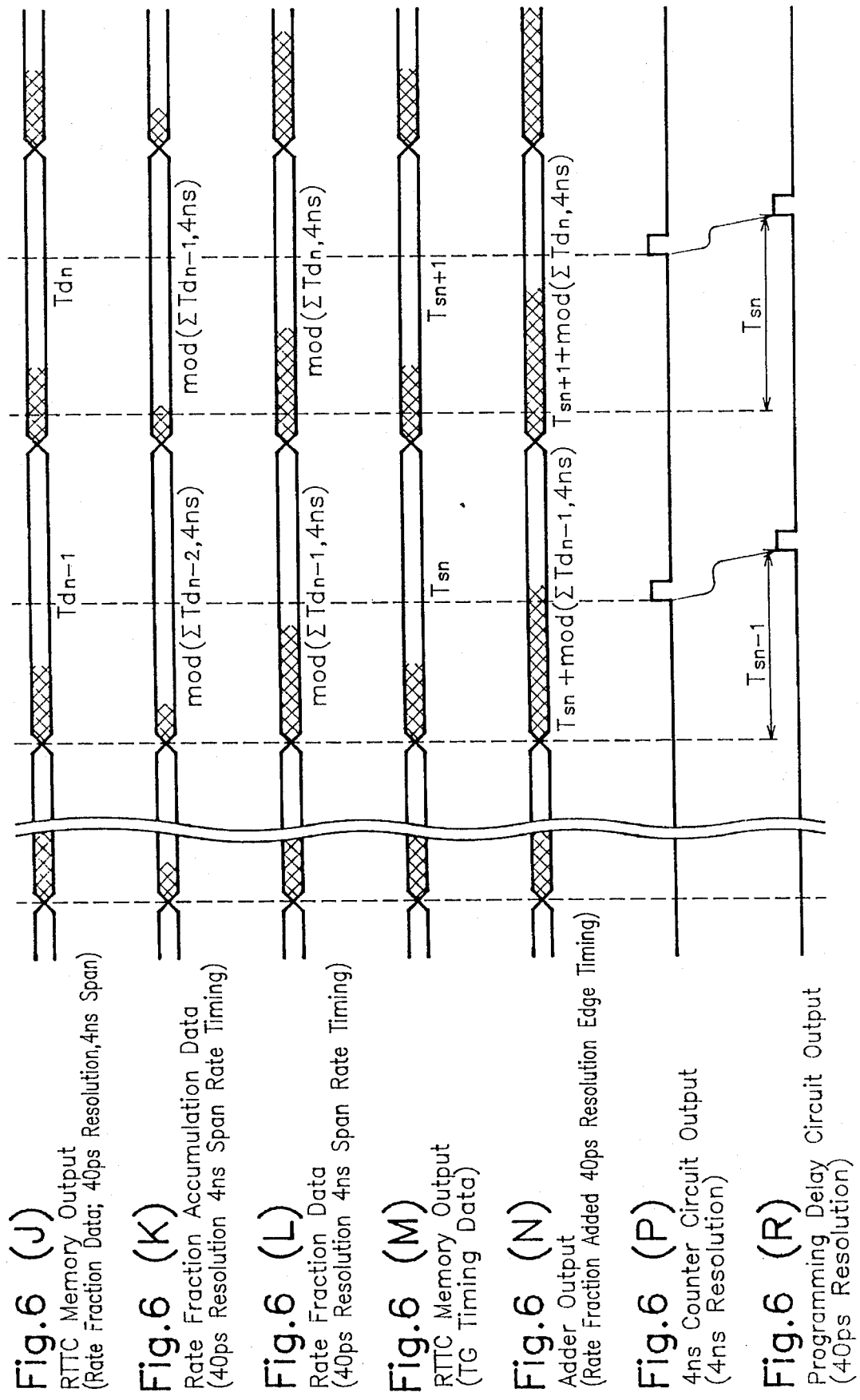

TIMING SIGNAL GENERATOR

BACKGROUND OF THE INVENTION

1. Field of Invention

This invention relates to timing signal generators; and more particularly, to such generators which generate timing signals having a set period and a delay time, and which may be used in LSI testing apparatus for testing semiconductor circuits.

2. Description of the Prior Art

The evolution of semiconductor devices, such as large scale integrated circuits (referred to as "LSI"), has been accompanied by increased complexity of various functions and construction thereof. Testing such devices involves using a LSI testing apparatus.

The LSI testing apparatus is generally constructed so as to determine the quality of the LSI to be tested (hereinafter referred to as a DUT) by applying a test signal, having various patterns and produced by test signal generating means, to the DUT, and by comparing the data output from the DUT with to an expected pattern prepared in advance in response to the applied test signal. In the test signal generating means, an accurate repeatable timing signal having a high resolution is used to create the test signal.

FIG. 1 shows a conventional timing signal generator, which is disclosed, for example, in Japan Patent S62/23495 and U.S. Pat. No. 4,231,104, and which comprises a rate generator for generating a reference clock Tsyn and a timing or rate signal Tout. The circuit comprises a programmable counter 1 for counting the clock Tosc from a quartz oscillator OSC and for outputting a dividing clock Tc having a period of m times the clock period (wherein m is an integer) when its value reaches a predetermined count, a first programmable delay apparatus (labelled "delay line") 2a for generating a timing signal having a period different from the m times the period of the clock Tosc by inputting clock Tc from programmable counter 1 and giving a delay period to the input dividing clock by repeatedly changing the delay time, and a second programmable delay apparatus (also labelled "delay line") 2b which gives the same amount of delay period as first delay apparatus 2a to the clock Tosc from oscillator OSC.

The delay times of delay apparatus 2a, 2b are controlled by data stored in register 3. The data stored in register 3 is provided by adder 4. Adder 4 adds delay time data stored in a memory 5 to data stored in register 3 and loads data of the sum to the register 3 with respect to timing signal Tout from delay apparatus 2a. Accordingly, data stored in register 3 is updated each time timing signal Tout is outputted.

FIGS. 2a, 2b and 2c show the case when a timing signal Tout having a period of 50 ns(nano-seconds) is generated by using the circuit of FIG. 1.

Assume that data 2, as a delay change number, is stored initially in memory 5, and data 3, as a preset value of counter 1, is stored in memory 6. Also, assume that 0 is stored initially in register 3, and the delay time or period introduced by delay apparatus 2a, 2b is zero.

FIG. 2a shows clock Tosc, having a period of 16 ns, provided to counter 1. Counter 1 is provided with a preset value 3 read out from memory 6, and counts downward from preset value 3 for each count of clock Tosc shown in FIG. 2a and outputs a dividing clock Tc at the third clock pulse (i.e. after 16 ns×3=48 ns) as shown in FIG. 2b. This dividing clock Tc is applied directly to first programmable delay apparatus 2a.

Adder 4 adds data 3, as the delay change number stored in memory 5, to delay change data 0 in the register 3 and stores added value 2 in register 3 with respect to the first timing signal Tout. Accordingly, a clock Tc applied next to first delay apparatus 2a is delayed by 2 ns, as shown in FIG. 2c, based on delay time number 2 stored in register 3 and is outputted as a timing signal Tout 1. This timing signal appears after 50 ns (i.e. 16 ns×3+2 ns), that is, after the first timing signal was outputted.

Adder 4 adds data 2 as the delay change number stored in memory 5 to delay change number data 2 stored in register 3 and stores the added value 4 in register 3 with respect to the timing signal Tout 1. Accordingly, a clock Tc, applied to first delay apparatus 2a, is delayed by 4 ns, as shown in FIG. 2c, based on the delay time number 4 stored in register 3 and is outputted as a timing signal Tout 2. Timing signal Tout 2 appears 50 ns after timing signal Tout 1.

Thus, timing signal Tout, having a period which is different from m times the period of clock Tosc, is obtained from first delay apparatus 2a by appropriately selecting the preset value stored in memory 6 and delay change number data stored in memory 5.

Reference clock Tsyn, which is synchronous with the timing signal Tout, may be also obtained in a similar manner.

The conventional timing signal generator just described, however, has various problems. For example, because the reference clock Tsyn is provided by delaying the clock from oscillator OSC using the second programmable delay apparatus 2b, a discontinuity in phase occurs in reference clock Tsyn at the time where the signal from the programmable counter is delayed, thereby degrading timing accuracy. Furthermore, because the conventional device supplies the dividing pulse from counter 1 to the first delay apparatus 2a to cause its delay, the leading edge of the dividing pulse is attenuated between the transmission lines, and hence, produces inaccuracies. Also, disadvantageously, the conventional device requires a large number of expensive programmable delay apparatus.

Such programmable delay apparatus has various problems. For example, the production of such apparatus requires a long trace on a printed circuit and requires a considerable area on the printed circuit board to form taps therefor.

Moreover, the conventional generator is disadvantageous in that a large number of programmable delay lines is used, and such large number of delay lines requires use of a circuit for correcting the delay times to maintain an accurate delay time. This increases the possibilities of error because drift is brought about even after correction is provided.

SUMMARY OF THE INVENTION

Accordingly, an object of the invention is to overcome the aforementioned and other deficiencies, disadvantages and problems of the prior art.

Another object is to provide a timing signal generator which is capable of generating a timing signal having a period different from m times the clock period and having a high resolution.

A further object is to provide a timing signal generator in which the number of signal lines between a rate generator and a timing generator is reduced, and wherein the timing signal generator generates a timing signal in accordance with the rate signal from a rate signal generator.

BRIEF DESCRIPTION OF THE DRAWINGS

FIGS. 6A through 6R are timing charts depicting exemplary operation of the embodiment.

DETAILED DESCRIPTION OF PREFERRED EMBODIMENTS

Figure 1:
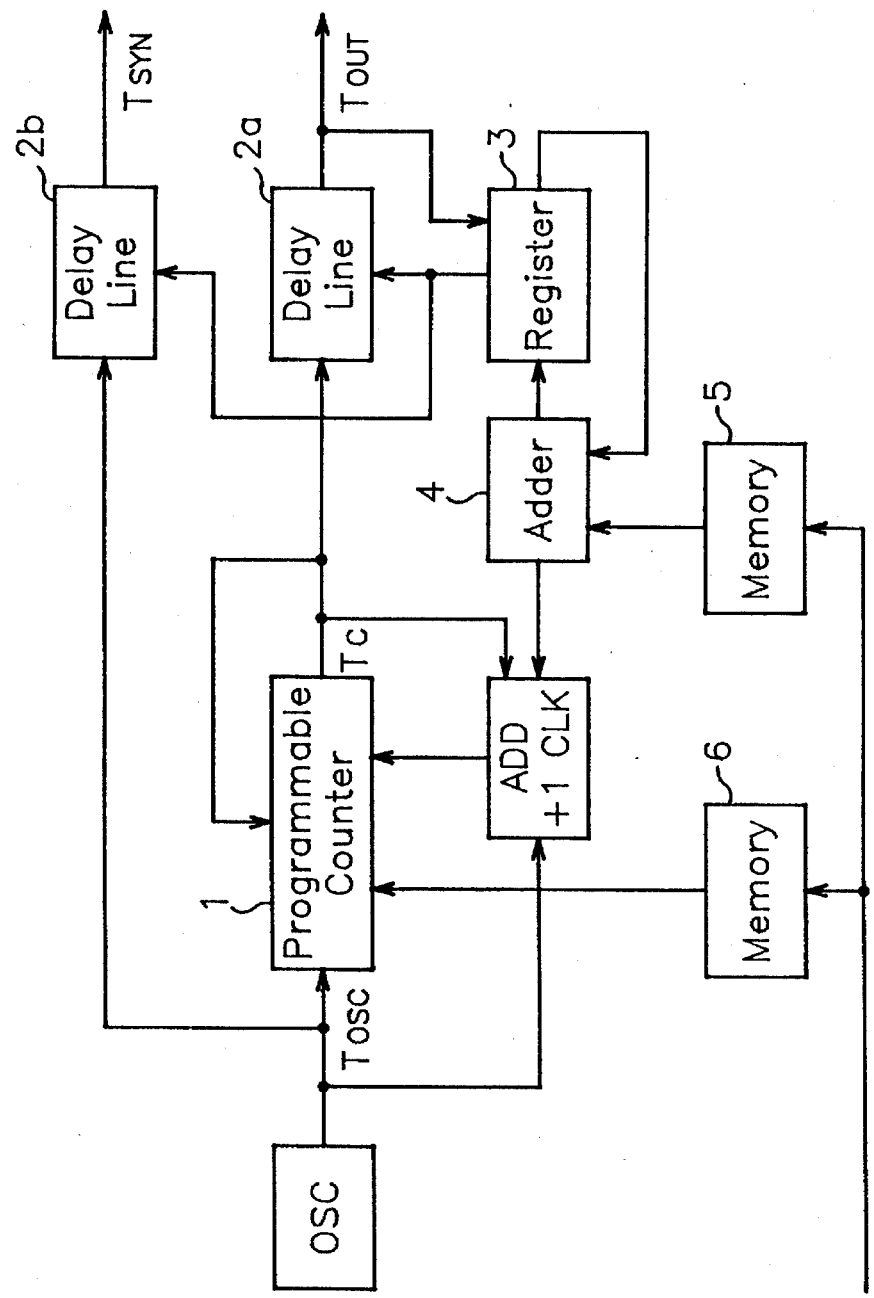
FIG. 1 si a block diagram depicting a conventional timing signal generator.
Figure 2:
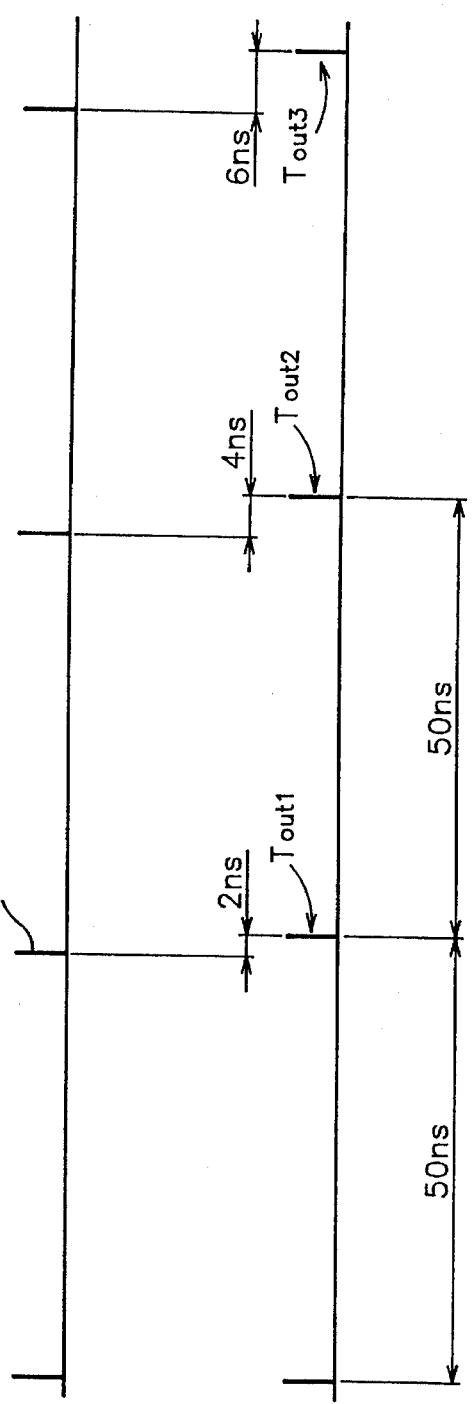
FIGS. 2a, 2b, and 2c, are timing charts depicting the case when a timing signal having a period of 50 ns is generated using the circuit of FIG. 1.
Figure 3:
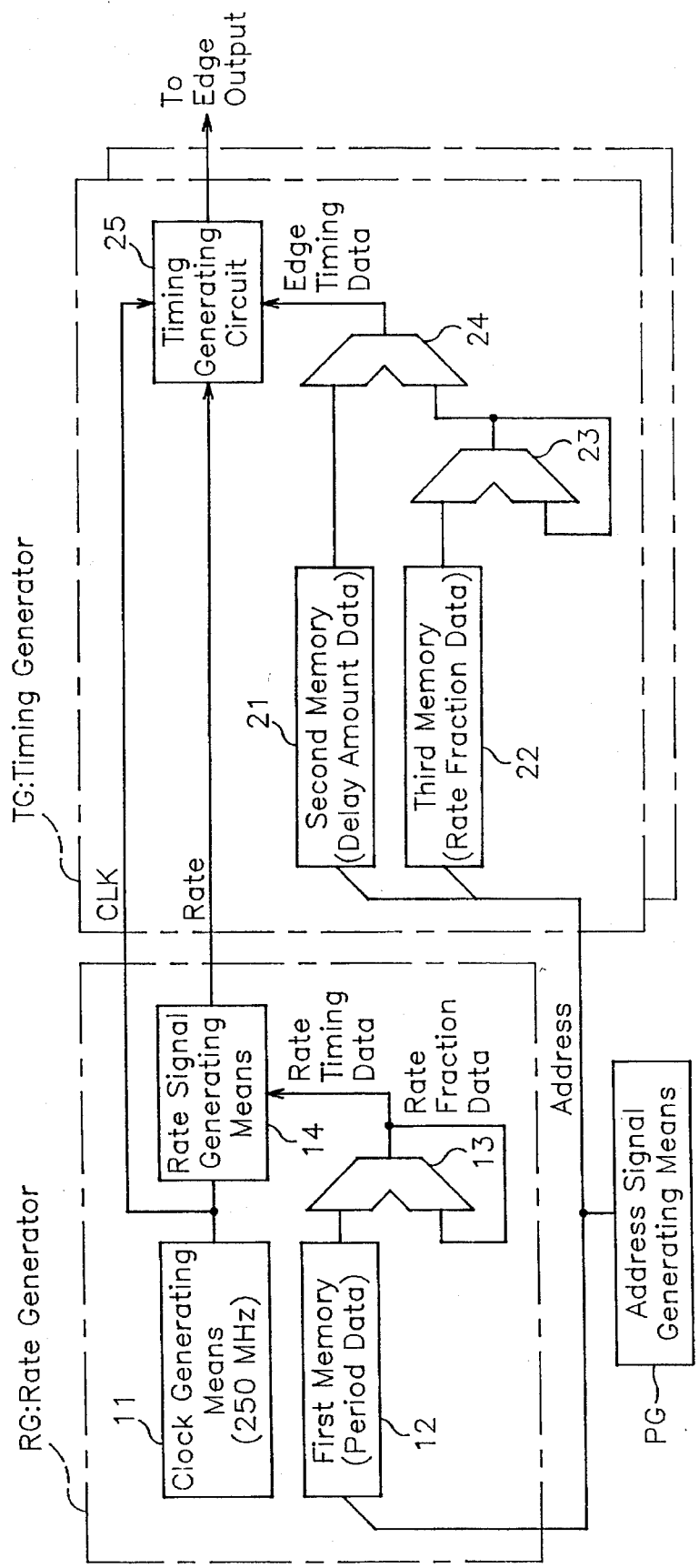
FIG. 3 is a block diagram depicting an illustrative embodiment of the invention.

FIG. 3 shows an illustrative embodiment of a timing signal generator comprising rate generator RG, timing generator TG, and address signal generator means DG. The term "timing signal" refers in general to a clock and pulse signal having a modifiable or adjustable arbitrary phase or delay with respect to a reference clock used in creating the timing signal and to a pulse signal having a period which is not m (wherein m is an integer) times the period of the reference clock.

In FIG. 3 rate generator RG outputs a reference clock signal CLK having a fixed period and a rate signal (i.e. a periodic signal) Rate; timing generator TG receives reference clock signal CLK and rate signal Rate from rate generator RG, and outputs an edge output signal To (which is also called the output timing pulse) having a user defined phase or delay period. Address signal generating means PG includes a CPU and is equipped to perform functions for outputting and address signal which is applied to each memory (12,21, 22) and for determining data (e.g. period and delay time) necessary for generating a timing signal.

Although only one block of timing generator TG is shown, a plurality of such timing generators are provided in correspondence with the number of pins of a DUT; and reference clock signal CLK and rate signal Rate are applied to each such plurality of timing generators TG.

Rate generator RG comprises a clock generating means 11, rate signal generating means 12, and first adder means 13.

The clock generating means 11, which may also be a quartz oscillator, for example, outputs a reference clock signal CLK of a fixed frequency, for example 250 MHz.

First memory 12 is a memory for storing periodic data (also called "rate data") D1 which may be for example a 25-bit data having a resolution of 40 ps and defines the period of the edge output signal to to be generated by the signal generator. A plurality of sets of periodic data are prepared and stored in first memory 12, which is capable of accommodating definitions of various edges, and are read out based on an address from address signal generating means PG.

First adder means 13 adds the periodic data D1 read out from first memory 12 with a rate fraction data D2 which was outputted in a previous cycle.

Rate signal generating means 14 is arranged so as to receive reference clock signal CLK from clock generating means 11, and to receive rate timing data Drate outputted from first adder means 13, and to output a rate signal Rate having a period which corresponds to the rate timing data. The rate timing data Drate provided to rate signal generating means 14 may be an 18-bit data having a resolution of 4 ns, for example, and 7 least significant bits, from among 25-bit added data outputted from first adder means 13, are truncated as fractional data. The fractional data of 7 least significant bits truncated at this time from the 25-bit data is added to the periodic data D1 read out from first memory 12 to create a new rate timing data, e.g. of 4 ns resolution. The fractional data of 7 least significant bits has a resolution of 40 ps and span of 4 ns.

Timing generator TG comprises second memory 21, third memory 22, second adder means 23, third adder means 24 and timing generating circuit 25.

Second memory 21 stores the delay time data. Third memory 22 stores the least significant fractional data, e.g. resolution of data being 40 ps and span of 4 ns, of data D1 which corresponds to the periodic data stored in first memory 12. A plurality of sets of data are prepared and stored in second memory 21 and third memory 22 in order to be able to accommodate definitions of various edges (i.e. timing pulses outputted by the generator).

Second adder means 23 adds the fractional data read out from third memory 22 with fractional data which was outputted in a previous cycle or time.

Third adder means 24 adds the delay time data read out from second memory 21 with the added data from second adder means 23 and outputs the sum as the edge timing data.

Timing pulse generating circuit 25 is arranged so as to receive reference clock signal CLK from clock generating means 11 and rate signal Rate from rate signal generating means 14, and edge timing data from third adder means 24, and to output a delay pulse (called edge output signal To) initialized by the rate signal Rate, and having a delay amount or period which corresponds to the edge timing data.

Figure 4:
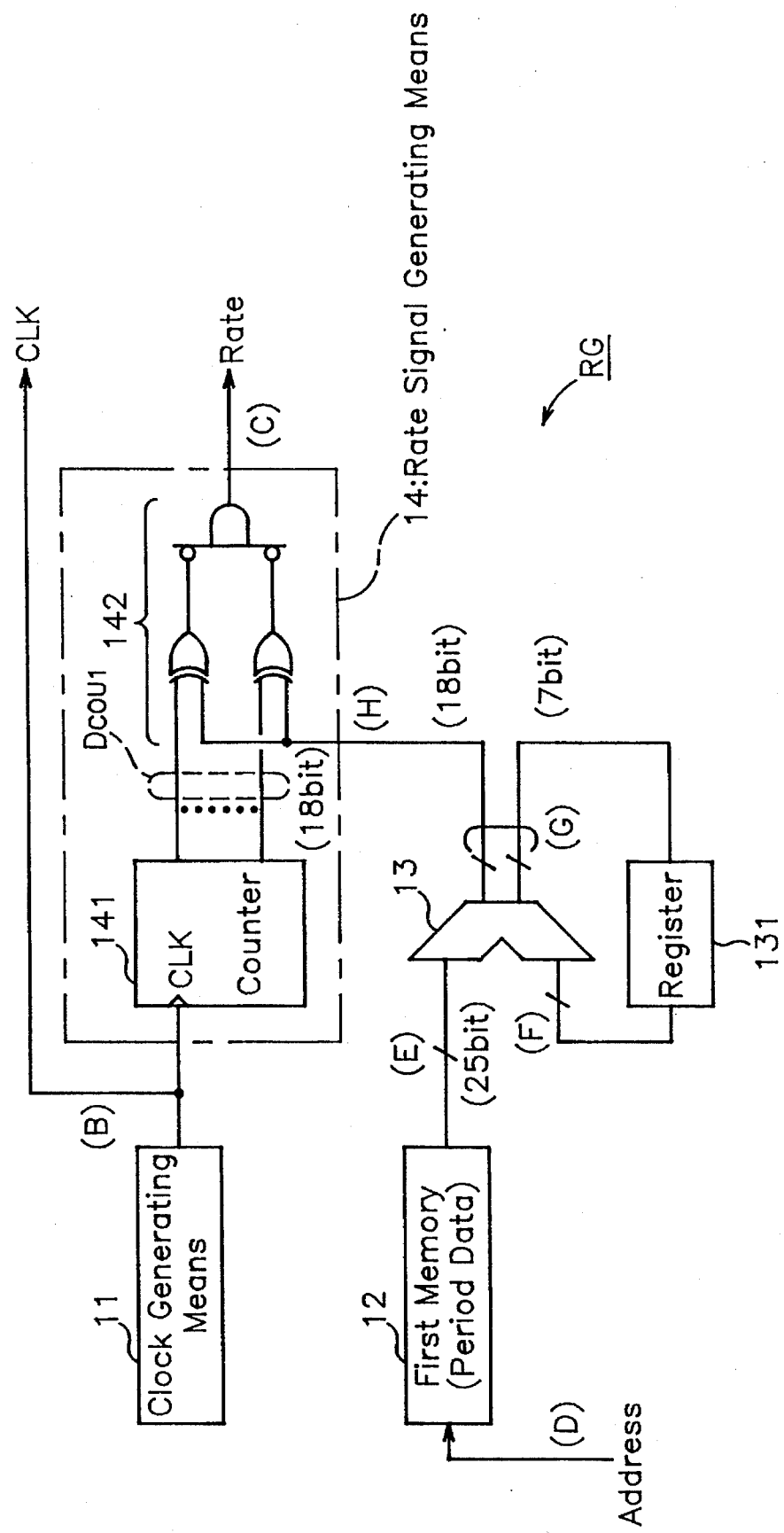
FIG. 4 is a block diagram depicting an illustrative example of the rate generator RG of FIG. 3.

FIG. 4 shows an example of the rate generator RG of FIG. 3 comprising the above discussed clock generating means 11, first memory 12, first adder 13, and rate signal generating means 14, wherein the various components thereof are further illustrated. Rate signal generating means 14 comprises a counter 141 for counting reference clock signal CLK; and digital comparison means 142 for detecting coincidences of counted data Dcou1 from counter 141 and rate timing data from first adder means 13. Also, first adder means 13 comprises a register 131 which is used to return the fractional data which may be the 7 least significant bits truncated from the 25-bit data in a previous cycle.

Figure 5:
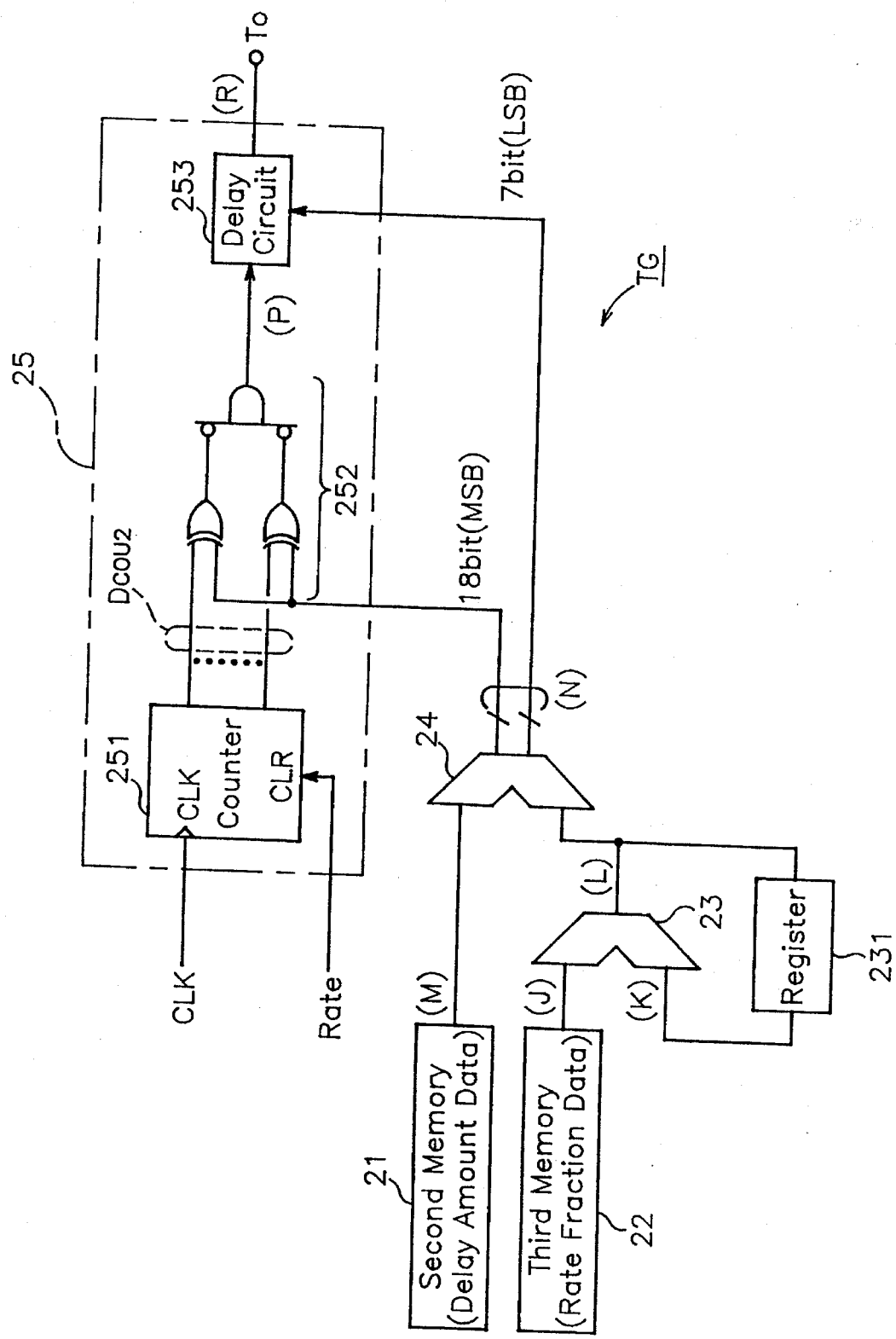
FIG. 5 is a block diagram depicting an illustrative example of the timing generator TG of FIG. 3.

FIG. 5 shows an example of the timing generator TG of FIG. 3 comprising the discussed second memory 21, third memory 22, second adder means 23, third adder means 24, and timing generator 25, wherein the various components thereof are further illustrated. Timing generating circuit 25 comprises a counter 251 which counts reference clock signals CLK and is reset by the rate signal Rate; digital comparison circuit 252 which detects coincidence of counted data Dcou2 from counter 251 with the edge timing data from third adder means 24; and a delay circuit 253 which receives a pulse signal from digital comparison means 252 and delay such pulse in response to low order data of the edge timing data from third adder means 24. The second adder means 23 comprises a register 231 used to return the low order data of rate fractional data, such as data of 7 least significant bits of the 25-bit data, outputted in a previous cycle.

The operation of the illustrative embodiment will now be discussed with reference to the timing charts of FIGS. 6A–6R, which correspond, respectively, to waveforms at the parts denoted by the reference characters in FIGS. 4 and 5.

FIG. 6A shows the user defined rate signal, wherein the waveform at each point is shown exemplified around (n−1) and (n) cycles.

FIG. 6B shows reference clock CLK, e.g. of 250 MHz, outputted by clock generating means 11. The period of the user defined rate signal is not in the relationship of m times the period of the reference clock.

The rate signal generating means 14 receives the reference clock CLK shown as creating a system internal rate signal Rate having the period of m times the reference clock, wherein m is an integer, as shown in FIG. 6C.

Address signal generating means PG provides an address signal to each memory 12,21, 22 with the period of the system internal rate signal Rate, as shown in FIG. 6D. Note that the address provided to each memory 12, 21, 22, is defined per cycle in advance by user definition. Data stored in the given address is read out from each memory 12,21,22, with the period of the system internal rate signal Rate.

Periodic data $(T_{n-1}, T_n, \ldots)$ read out from first memory 12, as shown in FIG. 6E, is supplied to first adder means 13 to be added to the output fractional data from the previous cycle, as shown in FIG. 6F. The fractional data is fractional data of less than 4 ns in the previous cycle and is represented by $\text{mod}(\Sigma Td_{n-2}, 4 \text{ ns})$, $\text{mod}(\Sigma Td_{n-1}, 4 \text{ ns})$, ....

First adder means 13 adds the periodic data to the fractional data from the previous cycle and outputs rate timing data represented as $[T_{n-1}+\text{mod}(\Sigma Td_{n-2}, 4 \text{ ns})$, $T_n+\text{mod}(\Sigma Td_{n-1}, 4 \text{ ns}), \ldots]$ with the period of the system internal rate signal Rate as shown in FIG. 6G. Among the rate timing data outputted from first adder means 13, rate timing data having a resolution of 4 ns (i.e. data of the 18 most significant bits amount 25-bits of data) is supplied to digital comparison means 142 of rate signal generating menas 14 as shown in FIG. 6H. Accordingly, the rate timing data supplied to the rate signal generating means 14 is represented as:

$$[T_{n-1}+\text{mod}(\Sigma Td_{n-2}, 4 \text{ ns})]/4 \text{ ns} \quad (1)$$

and fractional data (i.e. a fraction less than 4 ns) which could not be divided is accumulated and retained in register 131. Then, carrying occurs in a cycle in which the accumulated value of the fractional data exceeds 4 ns.

Digital comparison means 142 detects when the data Dcou1 from counter 141 coincides with expression (1) and outputs the system internal rate signal Rate, as shown in FIG. 6C. Accordingly, the system internal rate signal Rate is the fractional data accumulated in register 131 delayed by one reference clock at the cycle when the value reaches 4 ns.

In timing generator TG, the delay amount data $(Tsn, Tsn_{+1}, \ldots)$ is read out from second memory 21 with the period of the system internal rate signal Rate, as shown in FIG. 6M. Similarly, the rate fractional data $(Td_{n-1}, Td_n, \ldots)$ is read out from third memory 22, as shown in FIG. 6J. The rate fractional data stored in the third memory 22 corresponds to a fraction of the periodic data $(T_{n-1}, T_n, \ldots)$ stored in first memory 12 and its resolution is 40 ps and span of 4 ns.

The invention, advantageously, has third memory 22 in which the rate fractional data, which corresponds to the fraction of the periodic data $(T_{n-1}, T_n, \ldots)$ is stored in timing generator TG and no data related to the fraction of the periodic data $(T_{n-1}, T_n, \ldots)$ is supplied from rate generator RG.

Second adder means 23 adds the rate fractional data $(Td_{n-1}, Td_n, \ldots)$ from third memory 22 with the lower order data from rate generator RG (e.g. data of the 7 least significant bits of 25-bit data) oututted in a previous cycle and accumulated and retained in register 231; and furthermore, outputs the added value $\text{mod}(\Sigma Td_{n-1}, 4 \text{ ns})$, $\text{mod}(\Sigma Td_n, 4 \text{ ns}), \ldots$ as shown in FIG. 6L. Note that the accumulated value of the rate fractional data outputted from register 231 is the rate fractional data in the previous cycle, which is represented as $\text{mod}(\Sigma Td_{n-2}, 4 \text{ ns})$, $\text{mod}(\Sigma Td_{n-1}, 4 \text{ ns}) \ldots$, as shown in FIG. 6K.

Third adder means 24 adds the delay amount data read from second memory 21 to the output from second adder means 23 and outputs the added value $Tsn+\text{mod}(\Sigma Td_{n-1}, 4 \text{ ns})$, $Ts_{n+1}+\text{mod}(\Sigma Td_n, 4 \text{ ns}) \ldots$ to timing pulse generating circuit 25 as the edge timing data, as shown in FIG. 6N.

Counter 251 counts the reference clock CLK from rate generator RG with the period of the system internal rate signal Rate. Also, digital comparator 252 receives the 18 most significant bits of the edge timing data outputted from third adder means 24 and detects when the counted value Dcou2 of counter 251 becomes equal to the edge timing data. When the counted value Dcou2 of counter 251 becomes equal to the edge timing data, the comparator 252 outputs a delayed pulse signal having a resolution of 4 ns with the timing shown in FIG. 6P.

The pulse signal from digital comparator 252 is applied to delay circuit 253 where it is delayed by an amount which corresponds to data of the 7 least significant bits of the edge timing data and is outputted as the edge output signal, as shown in FIG. 6R. This edge output signal has a period different from the m times the period of the reference clock and has a higher resolution than the resolution of the reference clock, such as higher than 4 ns.

Note that although the frequency has been assumed to be 250 MHz of the clock from the quart oscillator, another frequency may be just as well used. Furthermore, although rate signal generating means 14 and timing pulse generating circuit 25 have been depicted as including the counter and the digital comparator, these circuits may also be constructed in the following manner, as an example. The rate signal generating means may comprise a counter to which rate timing data is loaded as a preset value and which counts downward the reference clock from the clock generating means; and zero detecting means for detecting when the value of the counter has reached zero, i.e. the value before data is loaded. Moreover, the timing generating circuit 25 may comprise a counter to which the edge timing data from the third adder means 24 is loaded as a preset value, which is reset by the rate signal from the rate signal generating means 14 and which counts downward the reference clock CLK from the clock generating means 11; and zero detecting means for detecting when the value of the counter has reached a zero value, i.e. the value before data is loaded.

As above discussed, the rate signal generated in the rate generator is used as the system internal rate signal and the edge signal is generated in each timing generator by using a reference clock whose phase continues and by using delay time data and rate fractional data available within the timing generator. The invention realizes the following and other advantages and effects.

Contrary to the prior art, no reference clock, whose phase is discontinuous needs to be applied to each timing generator, so that with the invention, the edge signal is generated with high accuracy.

Also, in the invention, the signals produced by the rate generator and applied to each timing generator are reference clocks whose phases are continuous and rate signals which are used as the system internal rates eliminate the need for information, such as the rate fractional data, to be applied to the timing generator, so that the system of the invention is considerably simplified.

Furthermore, in the invention, the number of delay circuits is reduced so that the problem otherwise caused by using delay lines is overcome.

What is claimed is:

1. A timing signal generator comprising:

a rate generator means for generating a reference clock and rate signal; and a timing generator means for receiving said reference clock and said rate signal from said rate signal generator means, and for generating an edge signal having a user defined delay period; wherein said rate generator means comprises:

clock generating means for generating said reference clock having a fixed period;

first memory means for storing periodic data;

first adder means for adding said periodic data obtained from said first memory means to fractional data of rate timing data from a previous cycle; and rate signal generating means for receiving said reference clock and said rate timing data, and for generating a rate signal having a predetermined resolution which corresponds to said periodic data; and wherein said timing generator means comprises:

second memory means for storing data of said delay period;

third memory means for storing fractional data of data corresponding to said periodic data stored in said first memory means;

second adder means for adding said fractional data obtained from said third memory means to fractional data of a previous cycle;

third adder means for adding said data of said delay period obtained from said second memory means to data from said second adder means to produce edge timing data; and timing pulse generating means for receiving said reference clock and said rate signal, and for generating a delay pulse which is initialized by said rate signal and which corresponds to said edge timing data.

2. The generator of claim 1, wherein said rate signal generating means comprises a counter means for counting said reference clock and digital comparator means for comparing counted data obtained from said counter means with said rate timing data from said first adder means.

3. The generator of claim 1, wherein said timing pulse generating means comprises counter means for counting said reference clock and being reset by said rate signal; digital comparator means for comparing counted dats from said counter means with edge timing data from said third adder means; and delay means for delaying a pulse generated by said digital comparator means in response to a least significant fractional data of said edge timing data.

4. The generator of claim 1, wherein said rate signal generating means comprises counter means for receiving said rate timing data from said adder means as a preset value and for counting downward said reference clock; and zero detecting means for detecting when the value of said counter means has reached zero.

5. The generator of claim 1, wherein said timing pulse generating means comprises counter means for receiving as a preset value edge timing data from said third adder means and being reset by said rate signal from said rate signal generating means, and for counting downward said reference clock, and zero detecting means for detecting when the value of said counter means reaches zero.

* * * * *